United States Patent [19]

Wadell et al.

[11] Patent Number: 4,894,753

[45] Date of Patent: Jan. 16, 1990

[54] ELECTRICAL CIRCUITRY SUPPORT APPARATUS

[75] Inventors: Brian C. Wadell, Reading; Bernard M. Cuddy, Cambridge, both of Mass.

[73] Assignee: Teradyne, Inc., Boston, Mass.

[21] Appl. No.: 243,068

[22] Filed: Sep. 9, 1988

[51] Int. Cl.⁴ .............................................. H05K 9/00
[52] U.S. Cl. .................................. 361/424; 174/35 R; 174/51; 361/413; 361/415
[58] Field of Search .................. 174/35 R, 51; 211/41; 361/413, 415, 424

[56] References Cited

U.S. PATENT DOCUMENTS

| | | | |
|---|---|---|---|
| 4,232,356 | 11/1980 | Saunders et al. | 361/415 |
| 4,386,390 | 5/1983 | Hammond | 361/415 |
| 4,429,937 | 2/1984 | Stockmaster | 361/415 |
| 4,574,332 | 5/1986 | Calabro | 361/415 |
| 4,620,265 | 10/1986 | Lerude et al. | 361/424 |
| 4,631,641 | 12/1986 | Brombal et al. | 361/424 |
| 4,642,735 | 2/1987 | Hodsdon et al. | 361/394 |
| 4,694,380 | 9/1987 | Mallory et al. | 361/415 |
| 4,716,495 | 12/1987 | Craker | 361/415 |

Primary Examiner—Gregory D. Thompson

[57] ABSTRACT

Electrical circuitry support apparatus including a card cage having slots for removably receiving circuit boards, and a plurality of circuit boards in the slots, at least one circuit board being a high-frequency board carrying an enclosure containing a high-frequency device. The enclosure provides shielding inhibiting transmission of high-frequency signals to or from the device.

15 Claims, 2 Drawing Sheets

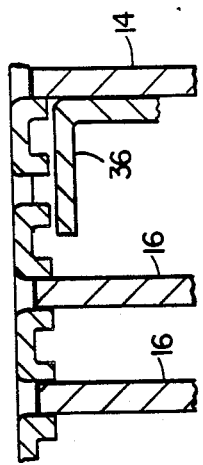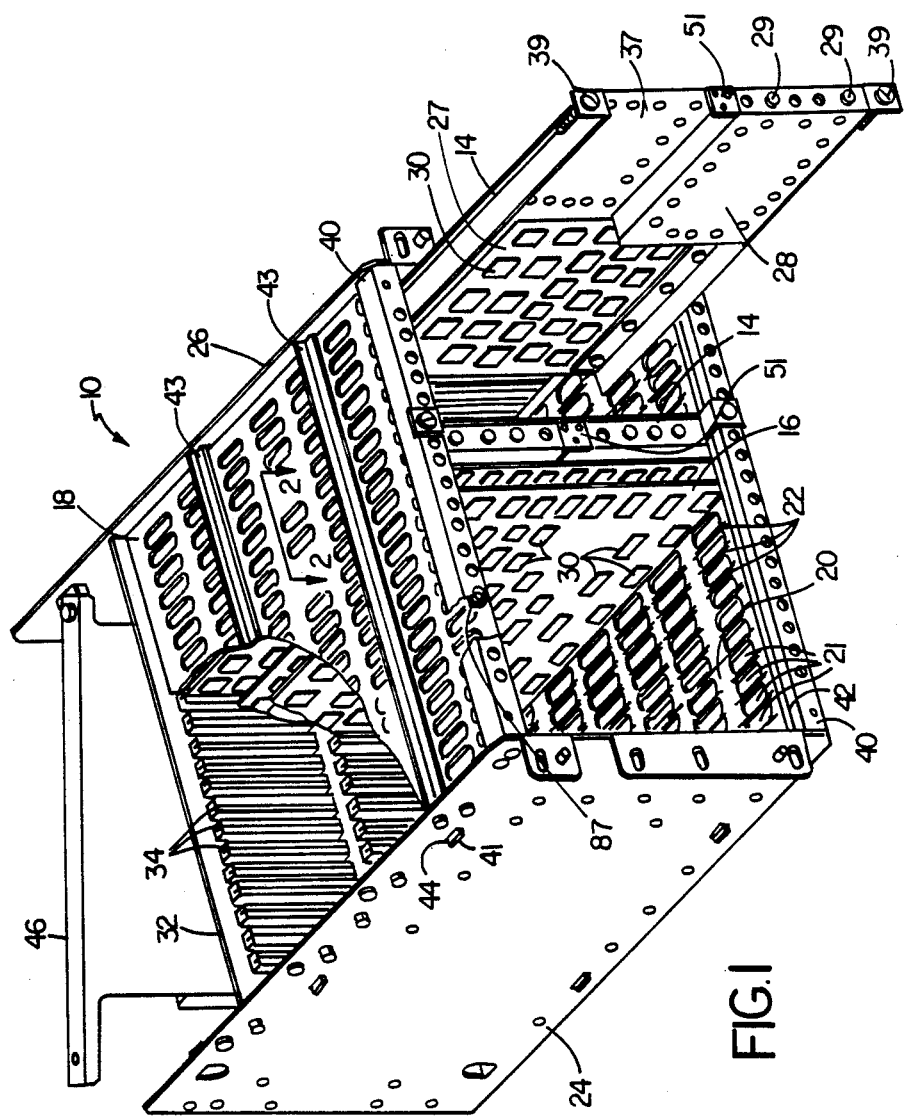

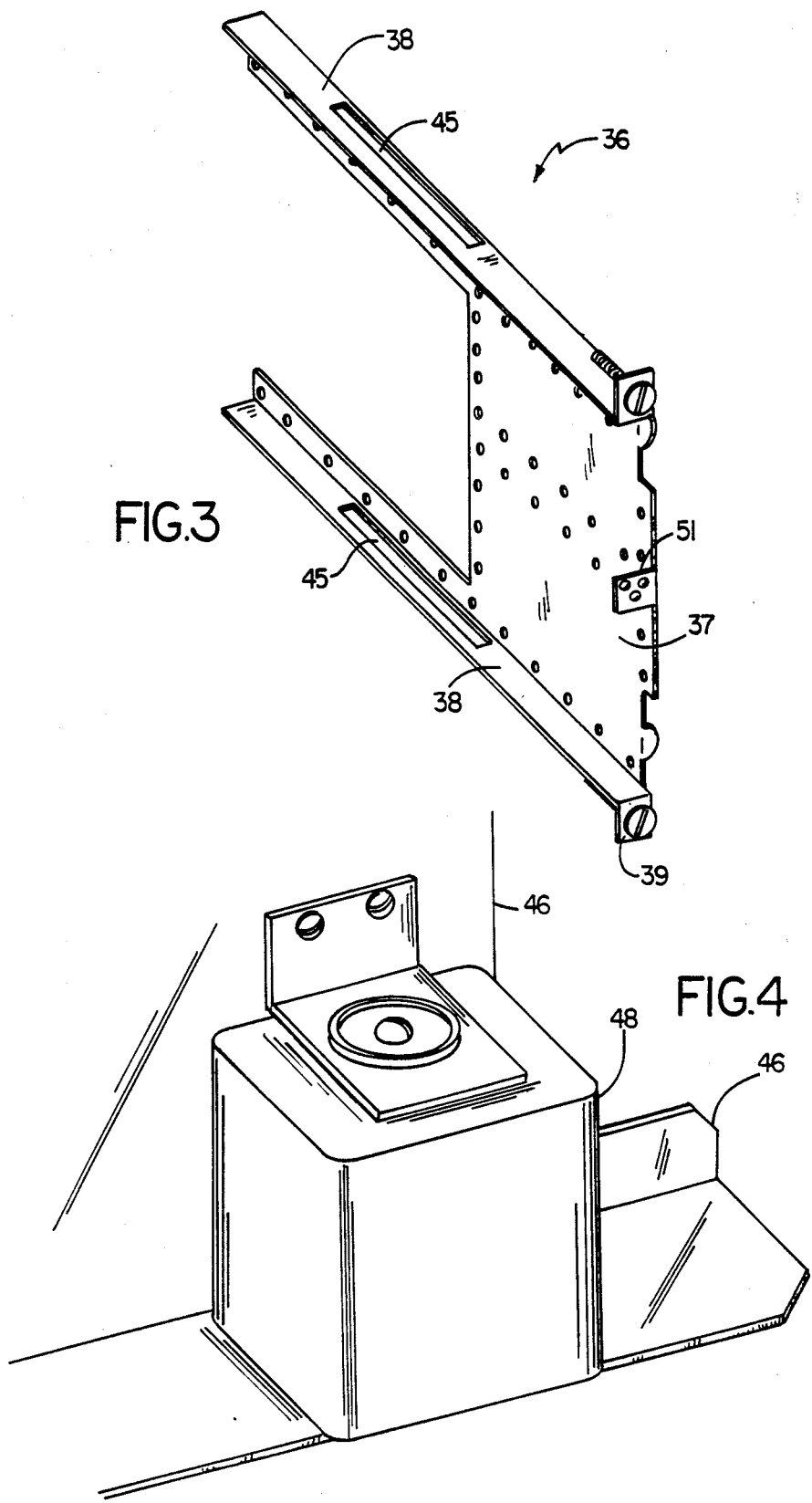

ELECTRICAL CIRCUITRY SUPPORT APPARATUS

FIELD OF THE INVENTION

The invention relates to apparatus for supporting electrical circuitry.

BACKGROUND OF THE INVENTION

Circuitry which operates at high frequencies generates signals that can propagate (by coupling, radiation or conduction) and interfere with the proper operation of other circuits. To prevent this, interfering and sensitive equipment are shielded from each other, and good ground paths are provided between components of the system. Most designs accomplish this with separate, dedicated low- and high-frequency areas within a card cage, the high-frequency areas including shielded enclosures containing the high-frequency components, i.e., metal enclosures that completely surround the components. The low-frequency area typically contains digital, power, and control circuitry.

As used hereinafter, "high-frequency" refers to signals above 1 MHz and includes signals in the "conventional high frequency" (3 to 30 MHz), very-high frequency (30 to 300 MHz), ultra-high frequency (300 MHz to 3 GHz), and SHF (3 to 30 GHz) bands, including radio frequency and microwave signals. In general, shielding is required for signals above 1 MHz, although it is possible to have some signals above 1 MHz that do not require shielding. As used hereinafter, "nonhigh-frequency" refers to digital, D.C., power, control, and low-frequency (frequencies below 1 MHz) signals or components.

SUMMARY OF THE INVENTION

It has been discovered that by providing a card cage having slots for circuit boards and a circuit board carrying a shielded enclosure containing high-frequency devices, the high-frequency and nonhigh-frequency circuitry could coexist in a single style card cage in any mix. This permits easy reconfigurration and avoids the unnecessary expense of unused radio frequency shielding in a card cage.

In preferred embodiments circuit boards that do not carry the shielded enclosures ("nonhigh-frequency boards") can be mounted in adjacent slots, and a circuit board carrying a shielded enclosure (a "high-frequency board") is mounted in an adjacent slot, if of a low-profile type, or is spaced on the side of the board carrying the enclosure from the adjacent circuit board by two slots, if of a high-profile type. Additionally, in preferred embodiments: there is a ground bar on the card cage extending along the side of an opening to the region in which the circuit boards are mounted; there are ears on the high-frequency boards that engage the ground bar to provide good grounding for the circuits; the shielded enclosures are mounted on support members on high-frequency boards near the ends adjacent to the ground bars, and nonhigh-frequency (e.g., digital) circuits are mounted on the other ends of the high-frequency boards; the support members include mounting plates that are electrically integral with the grounding ears and also include right-angle legs that extend along two sides of the high-frequency boards; there is a backplane at one end of the card cage and a backplane/daughter board connector to make electrical connection to the nonhigh-frequency components on the circuit boards from the backplane; the card cage has spaced, parallel guide plates with transverse punched-out portions that define the slots for circuit boards; there are tabs that pass through apertures on side plates at the two ends of the guide plates to accurately position the guide plates; high-frequency interconnects are made between shielded enclosures at the front of the card cage; and other shielded signals can pass between shielded enclosures by using a bracket on the mounting plate.

Other advantages and features of the invention will be apparent from the following description of a preferred embodiment thereof and from the claims.

DESCRIPTION OF THE PREFERRED EMBODIMENT

The preferred embodiment will now be described.

Drawings

FIG. 1 is a diagrammatic perspective view, partially broken away, of a card cage and circuit boards according to the invention.

FIG. 2 is a partial sectional view, taken at 2—2 of FIG. 1, showing the slotted engagement of circuit boards in the FIG. 1 card cage.

FIG. 3 is a perspective view of a metal support member used to mount shielded enclosures on a circuit board.

FIG. 4 is a perspective view of a vibration-sensitive component on a rear mounting plate of the FIG. 1 card cage.

STRUCTURE

Referring to FIGS. 1 and 2, there is shown card cage 10 having slots for receiving high-frequency board assemblies 14 and circuit boards 16 carrying electrical components providing automatic test circuitry. High-frequency board assemblies 14 include alternating current source and measurement instruments. Card cage 10 includes top and bottom guide plates 18, 20 having transverse, bent portions 22 punched-out from the sheet material to define slots 23 for receiving the circuit boards. Slots 23 are spaced every ¾". Side plates 24, 26 support guide plates 18, 20.

High-frequency board assembly 14 includes glass epoxy board 27, which carries both high-frequency components (operating between 1 MHz and 10 GHz in the radio frequency and microwave bands) within shielded enclosures 28 mounted at one end of the circuit board assembly and nonhigh-frequency (e.g., digital, power, control, and low frequency) components 30 on the other end of the circuit board assembly. Shielded enclosures 28 are either of a high-profile type, about 1.1" high and requiring an empty slot between it and the next board, or of a low-profile type, not requiring an empty slot. Shielded enclosures 28 provide shielding inhibiting transmission of high-frequency signals from the high-frequency components in them. The shielding also prevents transmission of such signals into the enclosures from outside. Nonhigh-frequency boards 16 carry only nonhigh-frequency components 30. The nonhigh-frequency components of circuit boards 16 and circuit board assemblies 14 are electrically connected to each other through backplane 32 via edge card connectors 34 mounted on backplane 32. Metal support member 36 (FIG. 3) is mounted on one side of each high-frequency board assembly 14; it includes flat portion 37 on which shielded enclosures 28 are bolted, right-angle legs 38 extending along the sides of the circuit board assembly to provide stiffening and distribute ground, bracket 51 for radio frequency connectors that access the nonhigh-frequency components on phenolic board 27, and ears 39 to make electrical connection to card cage ground bars 40, which extend along the sides of the opening to the region in which circuit boards 16 and circuit board assemblies 14 are mounted. Two shielded enclosures 28 can be mounted on a support member 36. Phenolic boards 27 include metallization making electrical ground connection with support member 36. Ears 39 are connected to bars 40 via captive bolts that are attached to floating nuts 47 within bars 40. Ground bars 40 also have slots 42 on their inward faces to receive standard card ejectors.

Top and bottom guide plates 18, 20 have tabs 41 that pass through apertures 44 in side plates 24, 26 in order to accurately position top and bottom guide plates 18, 20 and eliminate fixturing during assembly. Stiffener bars 43 extend along top and bottom guide plates 18, 20, to also provide accurate positioning of the guide plates, which might otherwise tend to be deformed by the punching operation. Mounting plate 46 is mounted at the rear of card cage 10 and used for mounting vibration sensitive component 48 (FIG. 4) or other oversize components (not shown). Mounting plate 46 can swing away to permit easy access to the rear of backplane 32 during debugging.

Operation

In use, high-frequency board assemblies 14 and non-high-frequency boards 16 are inserted in slots 23 provided by bent portions 22. The nonhigh-frequency board and high-frequency assemblies can coexist in card cage 10 in any mix, so long as an unused slot space is provided for any high-profile shielded enclosures 28. With this design, the high-frequency shielding is provided only to the circuitry within a configuration that requires it, permitting a reduction in shielding cost when less shielding is required. Standard card ejectors are used with slots 42 for insertion and removal of all boards.

Electrical connection to nonhigh-frequency components 30 is made through edge card connectors 34. Electrical connection to the high-frequency components in shielded enclosures 28 is made using coaxial connectors 29 and filtered connectors (not shown) through the enclosure walls. Grounding ears 39 and grounding bars 40 provide low impedance grounding between the high-frequency components within a card cage, which components can operate at up to 10 GHz. The holes 21 in guide plates 18, 20 resulting from the punching operation and holes 45 in right-angle legs 38 provide air cooling passages.

Other Embodiments

Other embodiments of the invention are within the scope of the following claims.

What is claimed is:

1. Electrical circuitry support apparatus comprising a card cage having two sets of facing slots for removably receiving circuit boards in a region between said two sets of slots, said card cage employing a ground bar extending along an opening to said region, and
a plurality of circuit boards in said slots, each board being received in one slot of one set and one slot of the other set,
at least one circuit board being a high-frequency board assembly including a shielded enclosure on a first side of said high frequency board assembly, said high-frequency board assembly containing a high-frequency device, the enclosure providing shielding inhibiting transmission of high-frequency signals from or to said device, said high-frequency board assembly having an ear that extends from said high-frequency board assembly and is electrically connected to said ground bar.

2. The apparatus of claim 1 wherein at least one said circuit board is a nonhigh-frequency circuit board, and wherein said high-frequency board assembly is spaced on said first side from an adjacent board by at least two slots, and wherein said at least one nonhigh-frequency circuit board has sufficiently low profile to be located in adjacent slots.

3. The apparatus of claim 1 wherein said high-frequency board assembly includes a metal support member including a flat portion on which said shielded enclosure is mounted on said high-frequency board assembly, said ear being an integral part of said support member.

4. The apparatus of claim 3 wherein said support member further comprises right-angle legs that extend along two sides of the high-frequency board assembly.

5. The apparatus of claim 1 wherein said enclosure is mounted on a portion of said high-frequency board assembly near said ground bar when said high frequency board assembly is received in said facing slots, and said high frequency board assembly also contains nonhigh-frequency components on other portions of said high-frequency board assembly.

6. The apparatus of claim 5 wherein said card cage further comprises
a backplane on the other side of said circuit boards from said ground bar, and
connectors making electrical connection between the circuit boards and the backplane.

7. The apparatus of claim 1 wherein said ground bar contains captive floating nut connectors for securing said ear to said ground bar.

8. The apparatus of claim 1 wherein said card cage includes parallel, spaced guide plates having transverse portions defining said slots.

9. The apparatus of claim 8 wherein said transverse portions are provided by punched-out, bent portions of said guide plates.

10. The apparatus of claim 8 wherein said card cage has side plates, and said guide plates have tabs that extend through holes in said side plates in order to accurately align said guide plates.

11. The apparatus of claim 10 wherein said card cage includes stiffening bars adjacent to said guide plates.

12. The apparatus of claim 1 wherein said card cage further comprises a mounting plate for vibration sensitive or oversize components.

13. The apparatus of claim 12 wherein said card cage further comprises a backplane located between said mounting plate and said region, and wherein said mounting plate is movably mounted to provide access to said backplane.

14. The apparatus of claim 1 wherein said circuit boards carry electrical components providing automatic test circuitry including high-frequency source and measurement instruments.

15. The apparatus of claim 3 wherein said support member further comprises a bracket on said flat portion for radio frequency connectors for nonhigh-frequency devices.

* * * * *